United States Patent
Tanaka

(10) Patent No.: US 7,375,427 B2
(45) Date of Patent: May 20, 2008

(54) SEMICONDUCTOR DEVICE, CIRCUIT BOARD, ELECTRO-OPTIC DEVICE, ELECTRONIC DEVICE

(75) Inventor: Shuichi Tanaka, Chino (JP)

(73) Assignee: Seiko Epson Corporation (JP)

( * ) Notice: Subject to any disclaimer, the term of this patent is extended or adjusted under 35 U.S.C. 154(b) by 197 days.

(21) Appl. No.: 11/257,457

(22) Filed: Oct. 24, 2005

(65) Prior Publication Data

US 2006/0091539 A1    May 4, 2006

(30) Foreign Application Priority Data

Oct. 28, 2004   (JP)   ............... 2004-313839

(51) Int. Cl.
*H01L 23/48*      (2006.01)
(52) U.S. Cl. .................... 257/737; 438/108
(58) Field of Classification Search ............... 257/737, 257/738, 778; 438/108, 613
See application file for complete search history.

(56) References Cited

U.S. PATENT DOCUMENTS 5,477,087 A * 12/1995 Kawakita et al. .......... 257/737
5,877,556 A * 3/1999 Jeng et al. .................. 257/737
6,281,111 B1   8/2001 Ohsumi
7,098,127 B2 * 8/2006 Ito ............................. 438/614

FOREIGN PATENT DOCUMENTS

| EP | 1 427 007 A2 | 6/2004 |
| JP | 64-013734 | 1/1989 |
| JP | 06-326108 | 11/1994 |
| JP | 10-321631 | 12/1998 |
| JP | 2001-110831 | 4/2001 |
| JP | 2004-186333 | 7/2004 |

* cited by examiner

*Primary Examiner*—Roy Karl Potter
(74) *Attorney, Agent, or Firm*—Harness, Dickey & Pierce, P.L.C.

(57) ABSTRACT

A semiconductor device including a semiconductor element, an electrode pad formed on the semiconductor element, and a bump electrode conductively connected to the electrode pad which includes a resin bump formed on an active face of the semiconductor element and a conductive layer provided from the electrode pad to the surface of the resin bump, the conductive layer and the resin bump being arranged without adhesion.

20 Claims, 6 Drawing Sheets

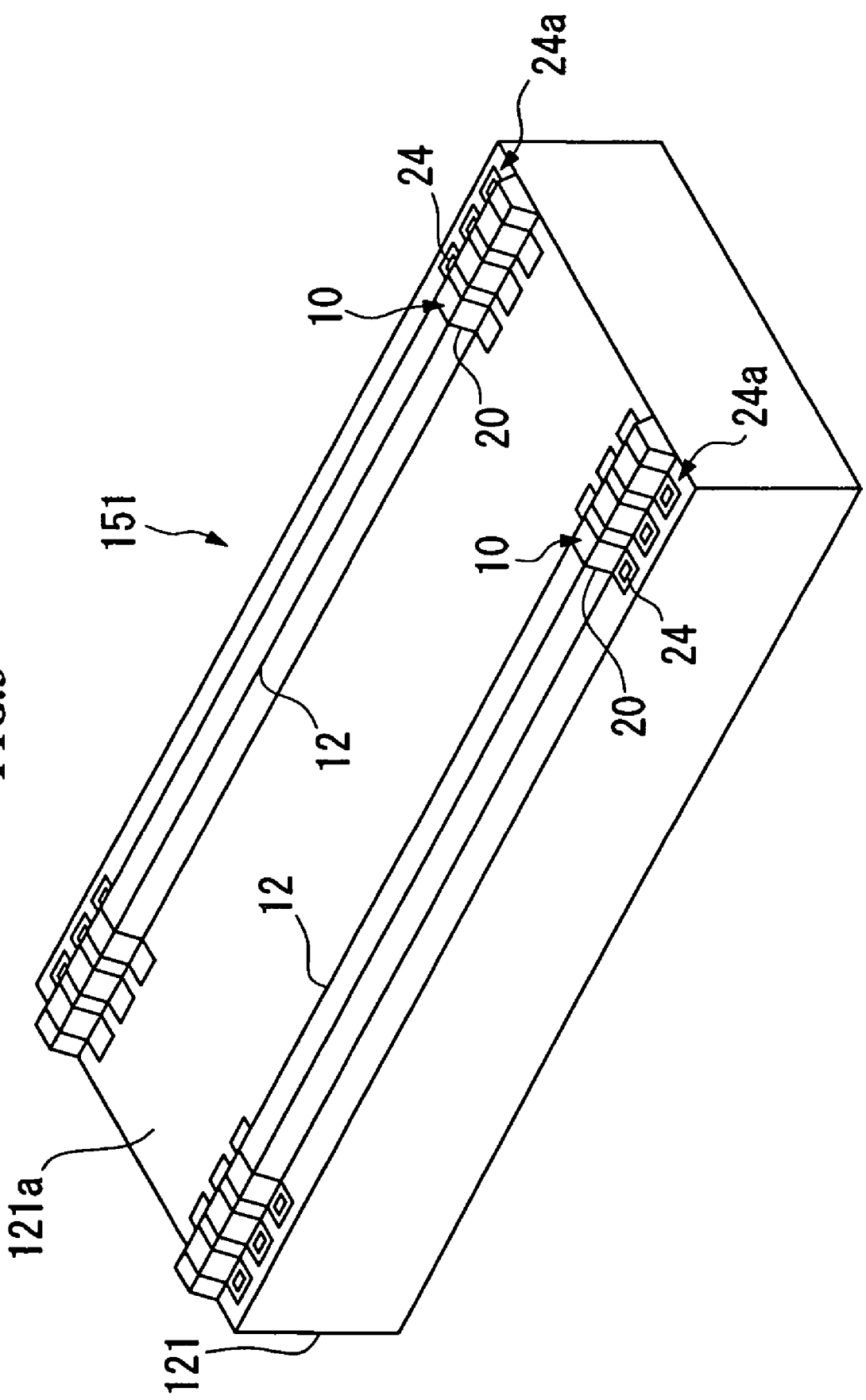

SEMICONDUCTOR DEVICE, CIRCUIT BOARD, ELECTRO-OPTIC DEVICE, ELECTRONIC DEVICE

BACKGROUND OF THE INVENTION

1. Field of the Invention

The present invention relates to a semiconductor device and its manufacturing method, a circuit board, an electro-optic device and an electronic device.

Priority is claimed on Japanese Patent Application No. 2004-313839, filed Oct. 28, 2004, the content of which is incorporated herein by reference.

2. Description of Related Art

In circuit boards and liquid crystal displays which are used in various kinds of electric devices, semiconductor devices such as integrated circuit chips (IC chips) are mounted on the boards. For example, in a liquid crystal display, an IC chip for activating a liquid crystal panel is mounted on a glass board (the partner board) which is a component of the liquid crystal panel (a so-called COG structure). In a case in which an IC chip made of hard silicon board is mounted on a hard glass board, it is hard to absorb warpage of the IC chip and the glass board. To solve this problem, bump electrodes are formed on the IC chip, and the IC chip is mounted on the glass board by compressing the bump electrodes. This process enables the IC chip and the glass board to be conductively connected.

Recently, terminals of IC chips are increasing in accordance with the high-definition of liquid crystal displays, and at the same time, downsizing of IC chips is eagerly demanded. To achieve this, narrowed pitches between bump electrodes formed on an IC chip are needed. Because an ordinary bump electrode is formed by carrying out electrolytic Au plating on an aperture of a plating resist, enlargement of the aspect ratio of the aperture is needed to narrow pitches between bump electrodes. Therefore, it is difficult to narrow pitches between bump electrodes.

A resin bump electrode 10 shown in FIG. 8 has been developed. The resin bump electrode 10 is made by forming a conducting layer 20 on a resin bump 12, and the conducting layer 20 is connected to an electrode pad 24 of an IC chip 21 (for example, refer to Japanese Unexamined Patent Application, First Publication No. H01-13734). The resin bump electrode 10 makes elastic deformation by contacting a partner board, and the warpage of the IC chip 21 and the partner board can be absorbed. Since this process does not require enlargement of the aspect ratio of the aperture, it is easier to narrow pitches between bump electrodes than in an ordinary method.

However, because the resin bump 12 has high coefficient of thermal expansion, when carrying out a hot press bond of the IC chip 21 and the partner board, the conductive layer 20 receives great tensile stress due to deforming following the expansion of the resin bump 12.

There are some cases in which sufficient reliability in the conductive connection is not obtained because of a breaking of the conductive layer 20 by the deformation of the resin bump 12 which deforms due to absorbing the pressure of the bonding.

SUMMARY OF THE INVENTION

The present invention provides a semiconductor device including a semiconductor element, an electrode pad formed on the semiconductor element, and a bump electrode conductively connected to the electrode pad which includes a resin bump formed on an active face of the semiconductor element, and a conductive layer provided from the electrode pad to the surface of the resin bump, the conductive layer and the resin bump being arranged without adhesion. A material with high ductibility such as Au is suitable for the conductive layer.

In the device, the conductive layer is free from elongation, shortening, and deforming in conjunction with the resin bump when the semiconductor device is joined to the board via the bump electrode. Therefore, the conductive layer receives less stress than when it is joined to the resin bump, and it becomes hard to break.

In the semiconductor device of the present invention, a space may be formed between the conductive layer and the resin bump. This enables sure reduction of the adhesion strength.

In the semiconductor device of the present invention, the conductive layer may be made of a metal which has weakened adhesion with the resin bump. More specifically, the conductive layer may be made of noble metal with weakened adhesion to the resin bump such as Au or Cu. Because noble metals are chemically stable, they react with water or oxygen in a resin very little. For example, Au usually does not generate any oxide, and Cu oxide is chemically unstable although it is generated. The adhesion between the conductive layer and the resin bump is strengthened by the chemical reaction caused by water or oxygen in the resin. (oxidative reaction). But because the conductive layer is made of a chemically stable noble metal such as Au or Cu in the present invention, no chemical reactions occur at the interface between the conductive layer and the resin bump. Therefore, the conductive layer and the resin bump have weakened adhesion. Because processes to weaken the adhesion between the conductive layer and the resin bump are not needed, it is possible to simplify the manufacturing process.

In the semiconductor device of the present invention, the conductive layer may be formed from the electrode pad to the other side across the resin bump, and join the active face at the other side.

As explained, because the conductive layer is formed so that the conductive layer and the resin bump have no adhesion, the conductive layer on the resin bump has no support in a case in which the formation of the conductive layer is ended on the resin bump. The portion of the conductive layer without support has a possibility of being removed when the semiconductor device joins the board. In the present invention, the conductive layer is extended to the other side of the resin bump, and joins the active face. Therefore, both sides of the conductive layer across the resin bump (the side fixed to the electrode pad and the side joined the active face across the resin bump) can be securely fixed on the active face. The above-described removal can be prevented.

In the semiconductor device of the present invention, a plurality of electrode pads may be provided in a line on the active face, and the resin bump may be formed straight along the line of the electrode pads, and the conductive layer may be formed from each electrode pad to the surface of the resin bump.

Because the single straight resin bump is provided for the plurality of the electrode pads in this structure, it is possible to simplify the manufacturing process.

The present invention provides a manufacturing method of a semiconductor device which has an electrode pad and a bump electrode conductively connected to the electrode pad on its active face, and the manufacturing method includes forming a resin bump on the semiconductor element and forming a conductive layer from the electrode pad to the surface of the resin bump without adhesion at the surface of the resin bump.

Through the processes, the conductive layer is made to be free from elongation, shortening, and deforming in conjunction with the resin bump when the semiconductor device is joined to the board via the bump electrode. Therefore, the conductive layer receives less stress than when it is joined the resin bump, and it becomes hard to break.

In the manufacturing method of the semiconductor device of the present invention, the conductive layer may be formed from the electrode pad to the other side across the resin bump, and may be joined to the active face at the other side.

Because both sides of the conductive layer across the resin bump can be securely fixed, the conductive layer becomes hard to remove when the semiconductor device joins the board.

In the manufacturing method of a semiconductor device of the present invention, the forming of the conductive layer may include forming a sacrifice layer between the conductive layer and the resin bump and forming a space between the conductive layer and the resin bump by removing the sacrifice layer on the resin bump. This enables sure reduction of the adhesion strength.

In the manufacturing method of a semiconductor device of the present invention, the form of the space may include removing the sacrifice layer on the resin bump by etching utilizing the difference in etching rate between the surface of the active face and the surface of the resin bump while the sacrifice layer on the active face remains.

The inventors of the present invention recognized that the etching rate depends on the surface condition of the board. For example, in a case that a resin bump made of epoxy resin is formed on the board made of silicone resin and TiW is plated on that, the TiW plated on the resin bump is etched faster than the TiW plated on the silicone board when etching with hydrogen peroxide. The present invention selectively removes the sacrifice layer, utilizing the difference in etching rate. Because the present invention needs only a single etching of the whole active face to form a space, it makes it possible to simplify the manufacturing process.

The active face may be made of inorganic material. Because a bigger difference in the surface condition from the resin bump can be made, this makes it possible to carry out the etching more effectively.

In the manufacturing method of a semiconductor device of the present invention, the conductive layer may be formed by plating while the sacrifice layer is used as a seed layer.

Because the conductive layer becomes easy to make thicker, a breaking of the conductive layer when joining the active face can be prevented more certainly. The resistance of the conductive layer also can be reduced by thickening the conductive layer.

In the manufacturing method of a semiconductor device of the present invention, the forming of the conductive layer may include forming a conductive layer without adhesion to the resin bump by evaporating or sputtering a noble metal.

Because chemically stable materials such as noble metals are used as the conductive layer, no chemical reactions with the resin bump (such as oxidation by water or oxygen in the resin bump) occur. Therefore, the conductive layer and the resin bump have weakened adhesion. Because the conductive layer can be made without processes to form and remove the sacrifice layer, it is possible to simplify the manufacturing process.

In the manufacturing method of a semiconductor device of the present invention, a plurality of the electrode pads may be provided in a line on the active face, and the resin bump may be formed straight along the line of the electrode pads, and the conductive layer may be formed from each electrode pad to the surface of the resin bump.

Because the single straight resin bump is provided for the plurality of the electrode pads in this structure, it makes it possible to simplify the manufacturing process.

In the manufacturing method of a semiconductor device of the present invention, cutting the resin bump and separating the bump electrode according to the electrode pads may be included.

Because the resin bump is separated for each conductive layer, the effect of heat expansion or a deformation of the resin bump on each conductive layer when the semiconductor device joins the board can be minimized.

The present invention provides a circuit board on which the semiconductor device of the present invention is mounted, and the semiconductor is conductively connected to the electrode terminal of the circuit board by the conductive layer arranged on the resin bump.

A circuit board which has better reliability in its conductive connection can be provided by the present invention.

In the circuit board of the present invention, the conductive layer contacts the circuit by elastic deformation of the resin bump and the semiconductor device and the electrode terminals may be supported by a sealing resin filled around the conductive connection of the semiconductor device and the electrode terminals.

Because the conductive layer covers the resin bump in the electrode bump, it is easy to cause elastic deformation by pressing the electrode terminal onto the circuit board, and the elastic deformation of the bump electrode is maintained by a sealing resin filled around the conductive connection. The condition in which the circuit board and the bump electrode are joined with elastic deformation generates a reactive force (a pushing force) continually. This makes it possible to maintain the conductive connection and high reliability in the conductive connection can be obtained. Because this structure does not need any expensive materials such as an anisotropic conductive film or anisotropic conductive paste, this contributes to reduce cost for manufacturing.

The present invention provides an electro-optic device which is equipped with the semiconductor device of the present invention or the circuit board of the present invention.

The present invention provides an electronic device which is equipped with the circuit board of the present invention or the electro-optic device of the present invention.

An electro-optic device or an electronic device with high reliability in its conductive connection can be provided by the present invention.

BRIEF DESCRIPTION OF THE DRAWINGS

FIG. 3 is a perspective view of the semiconductor device according to the first embodiment.

DETAILED DESCRIPTION OF THE INVENTION

Figure 1:
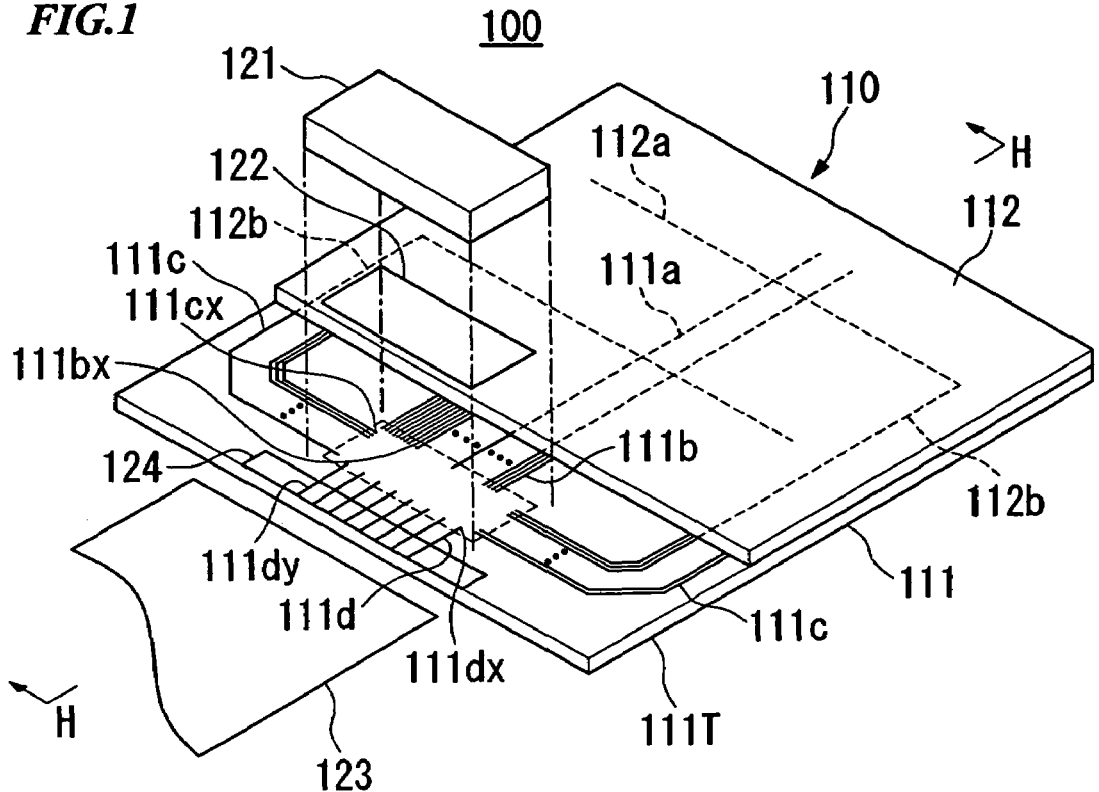
FIG. 1 is a drawing of the liquid crystal display illustrating an embodiment of the electro-optic device.

An explanation of embodiments of the present invention is given, referring to the drawings. In the drawings, the thickness and the size of each component are not to scale for better explanation.

First Embodiment

Electro-Optic Device

FIG. 1 is a drawing of a liquid crystal display of an electro-optic device according to an embodiment of the present invention. A liquid crystal display device 100 in FIG. 1 has a liquid crystal panel 110 and a semiconductor element 121 disposed thereon. A deflecting plate, a reflecting sheet, a backlight or other additional portions which are not shown in the drawing are provided as required.

The liquid crystal panel 110 has a board 111 and a board 112 made of glass or plastic. The board 111 and the board 112 are disposed opposite each other, and are adhered together by a seal which is not shown in the drawing. Liquid crystal made of an electro-optic material is included between the board 111 and the board 112 (not shown in FIG. 1). An electrode 111a made of a clear conductive material such as ITO (Indium Tin Oxide) is formed on the surface inside the board 111, and an electrode 112a which is faced perpendicularly to the electrode 111a is formed on the surface inside the board 112. The electrode 111a and the electrode 112a extend out to a protruding portion 111T, and electrode terminals 111bx and 111cx are formed at the terminal of each electrode, respectively. Input wiring 111d is formed near the terminal of the protruding portion 111T, and a terminal 111dx is formed at the inner edge of the protruding portion 111T.

The semiconductor element 121 is mounted on the protruding portion 111T with a sealing resin 122. The semiconductor element 121 is, for example, an IC chip for activating the liquid crystal panel 110. A plurality of bump electrodes (not shown in FIG. 1) are formed on the underside of the semiconductor element 121, and the bump electrodes are conductively connected to each terminal 111bx, 111cx and 111dx on the protruding portion 111T.

A flexible circuit board 123 is connected via an anisotropic conductive layer 124 to input terminals 111dy which are formed at the outer end of input wiring 111d. The input terminals 111dy are conductively connected to each wiring (not shown in FIG. 1) provided on the flexible circuit board 123. A control signal, a picture signal or potential of power or other external electric signals are provided to the input wiring 111dy via the flexible circuit board 123. Then, an activating signal to activate the liquid crystal is generated in the semiconductor element 121 and provided to the liquid crystal panel 110.

The liquid crystal display device 100 of this embodiment constructed in the above-described manner is able to carry out optical modulation by reorienting the liquid crystal pixels by applying a voltage between the perpendicularly placed electrodes 111a and 112a via the semiconductor element 121. Therefore, it is possible to form desired picture on a display region in the liquid crystal panel 110 where the pixels are arranged.

Figure 2:
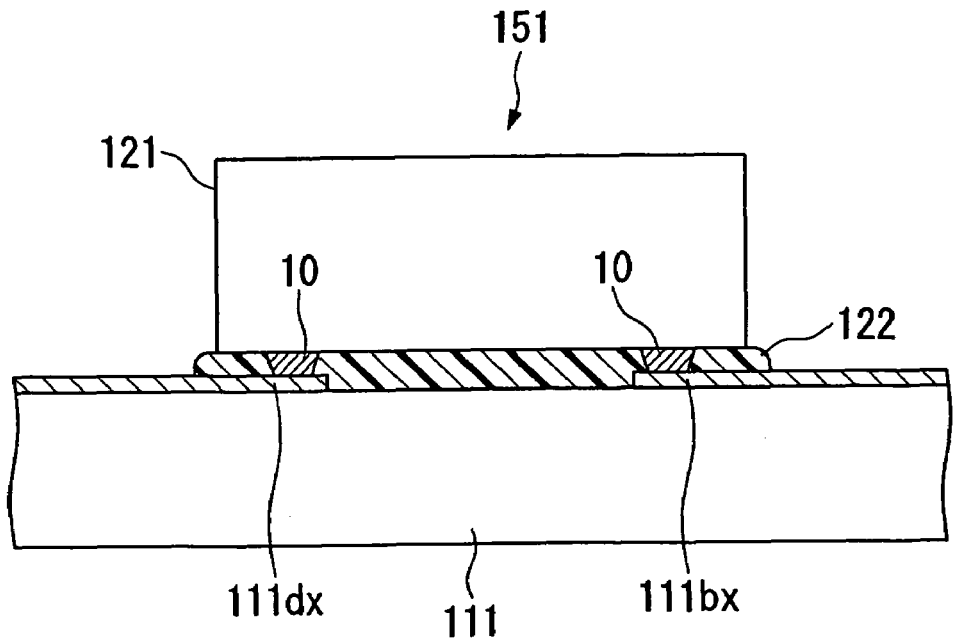
FIG. 2 is a drawing of the mounting structure of the semiconductor device in the liquid crystal display.

FIG. 2 is a side sectional view along line H-H in FIG. 1 showing the mounting structure of a semiconductor device 151 in the liquid crystal display device 100. As shown in FIG. 2, a plurality of resin bump electrodes 10 are provided on the active face (the underside in FIG. 2) as terminals of the IC chip. The tips of the resin bump electrodes 10 have a direct conductive connection to the terminals 111bx and 111dx of the board 111. A hardened sealing resin 122 made of a thermosetting resin surrounds the conductive connection between the resin bump electrodes 10 and the electrodes 111bx and 111dx.

Semiconductor Device

An explanation of the structure of the terminals of the semiconductor device 151 is given. FIG. 3 is a perspective view showing the structure of the active face of the semiconductor device 151 where the terminals are formed.

The semiconductor element 121 is, for example, an IC chip for activating the liquid crystal device. An electronic circuit (an integrated circuit) which has a plurality of electron devices such as thin-film transistors and wiring which connects each electron device is formed on an active face of the semiconductor element 121 (not shown in FIG. 3). In the semiconductor element 121 shown in FIG. 3, a plurality of electrode pads 24 are arranged in a line along the longer side of the active face 121a. The electrode pads 24 protrude from the above-described electron devices, and function as outer electrodes of the electronic circuit. To the inside of the electrode pad line 24a on the active face 121a, a resin bump 12 is formed straight along the electrode pad line 24a. A plurality of conductive layers 20 are formed from the surface of each electrode pad 24 over the surface of the resin bump 12. Bump electrodes 10 consist of the resin bump 12 and each conductive layer 20 arranged on the resin bump 12.

Figure 4A:
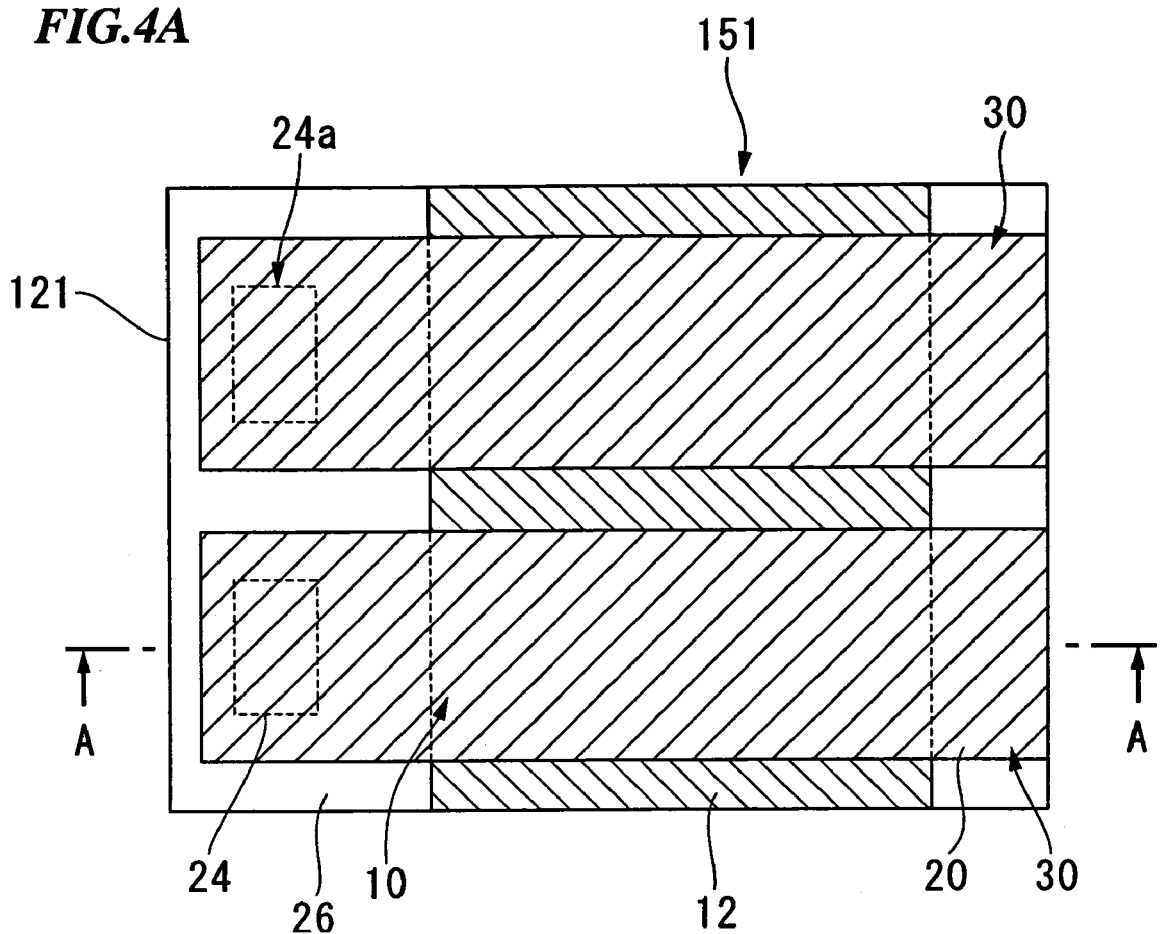
FIG. 4A is an enlarged plan view around the resin bump electrodes of the semiconductor device of the first embodiment.
Figure 4B:
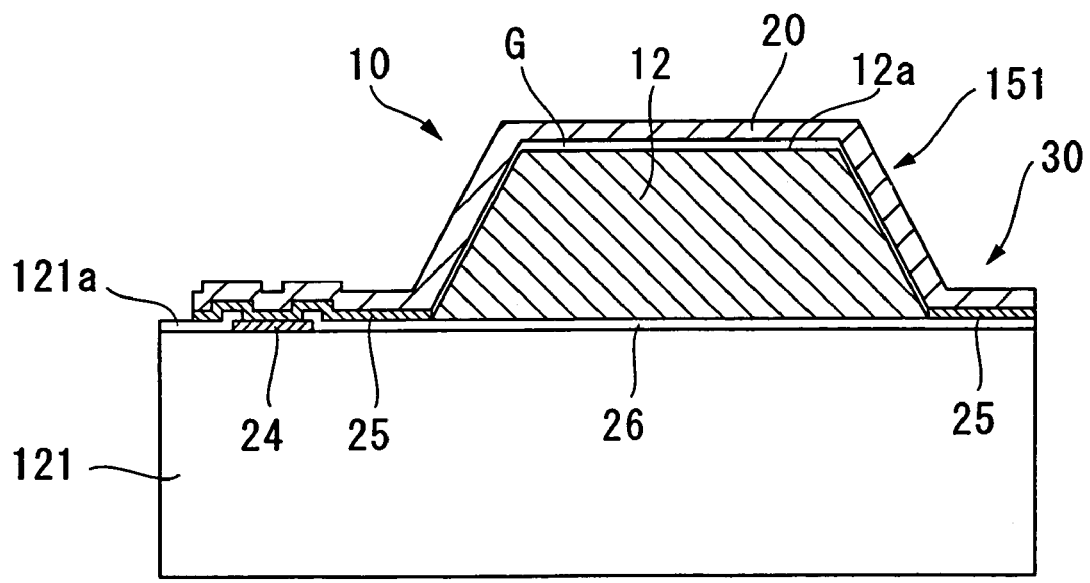
FIG. 4B is a side sectional view along line A-A in FIG. 4A.

FIGS. 4A and 4B are drawings of the main part of the resin bump electrode 10. FIG. 4A is an enlarged plan view around the resin bump electrodes 10, and FIG. 4B is a side sectional drawing along line A-A in FIG. 4A. As shown in FIGS. 4A and 4B, the plurality of electrode pads 24 made of aluminum or other conducting material are arranged in a line around the edge of the active face 121a of the semiconductor element 121. A passivation layer 26 made of SiN or other electric insulating material is formed over the entire active face 121a of the semiconductor element 121, except for an aperture which is formed on each electrode pad 24.

The resin bump 12 is formed on the passivation layer 26, to the inside of the electrode pad line 24a. The resin bump 12 is a straight bump arranged along the electrode pad line 24a. The resin bump 12 is made of polyimide resin, acrylic resin, phenol resin, epoxy resin, silicone resin, modified polyimide resin or other elastic resin materials. It is desirable that the resin bump 12 be shaped as a trapezoid or half-cylinder since this provides easy for elastic deformation in the cross-sectional surface. This enables the resin bump electrode 10 to perform elastic deformation easily when the resin bump electrode 10 is joined to the board 111, and contributes to improving the reliability of the conductive connection between the resin bump electrode 10 and the board.

The plurality of conductive layers 20 are formed from the surface of each electrode pad 24 over the surface of the resin bump 12. The conductive layer 20 is made of Au, TiW, Cu, Ni, Pd, Al, Cr, Ti, W, NiV, Pb-free solder or other conducting materials. The conductive layer 20 is conductively connected to the electrode pad 24 via a seed layer 25 arranged on the active face 121a of the semiconductor element 121. The seed layer 25 is provided on either side of the resin bump 12 and is formed as follows: a conducting material such as TiW is formed on the entire active face 121a, and the conducting material on the surface of the resin bump 12 is selectively etched with an iodate solution which includes potassium iodide. The conductive layer 20 is formed by plating on the surface of the seed layer 25, and the removal of the seed layer 25 is carried out after the formation of the conductive layer 20. Thus, a space G is formed between the conductive layer 20 and the resin bump 12 by removing the seed layer 25. In other words, the seed layer 25 on the bump surface 12a is formed as a sacrifice layer to form the space G under the conductive layer 20. By removing the sacrifice layer, the conductive layer 20 and the resin bump 12 have no adhesion.

The conductive layer 20 is formed from the electrode pad 24 to the other side of the resin bump 12, and joins the active face 121a. Thus, the conductive layer 20 joins the surface of the electrode pad 24 to the outside of the resin bump 12, being formed to the active face 121a to the inside of the resin bump 12 over the surface of the resin bump 12, and joins the seed layer 25 or the passivation layer 26 on the active face 121a to the inside of the resin bump 12. Because the conductive layer 20 is fixed to the active face 121a, on either side of the resin bump 12, although it is not fixed on the resin bump 12, it is hard for the conductive layer 20 to be removed when joining to the board.

In FIG. 2, the resin bump electrode 10 is compressed by thermocompression to the terminal 111bx on the board 111 with the sealing resin 122. The sealing resin 122 is a thermosetting resin, and is in a non-hardened or half-hardened state before mounting. In a case where the sealing resin 122 is in the non-hardened state, it is applied to the surface of the active face of the semiconductor element 121 (the underside in FIG. 1) or the surface of the board 111 before mounting. In a case where the sealing resin 122 is in the half-hardened state, it is inserted between the semiconductor device 151 and the board 111 as a film or a sheet. Epoxy resin is generally used as the sealing resin 122. Other resins may be used as long as the purpose is achieved.

The mounting of the semiconductor device 151 is carried out by pressurizing the semiconductor device 151 onto the board 111 while heating with a hot-press head which is not shown in FIG. 1. During the process, the sealing resin 122 is softened by heating, and the top of the resin bump electrode 10 is conductively connected to the terminal 111bx, pushing aside the softened resin. The resin bump 12 is elastically deformed in the connecting direction (the vertical direction in FIG. 1) by pressurizing. In this condition, continuous heating causes the sealing resin 122 to bridge and harden, and the resin bump electrode 10 maintains the elastic deformation by the sealing resin 122, connecting conductively to the terminal 111bx even after releasing the pressurization.

Manufacturing Method of the Semiconductor Device

An explanation of the method for manufacturing the semiconductor device according to an embodiment of the present invention is given. FIGS. 5A through 5D are process drawings showing an example of the manufacturing method of the semiconductor device 151.

Figure 5A:
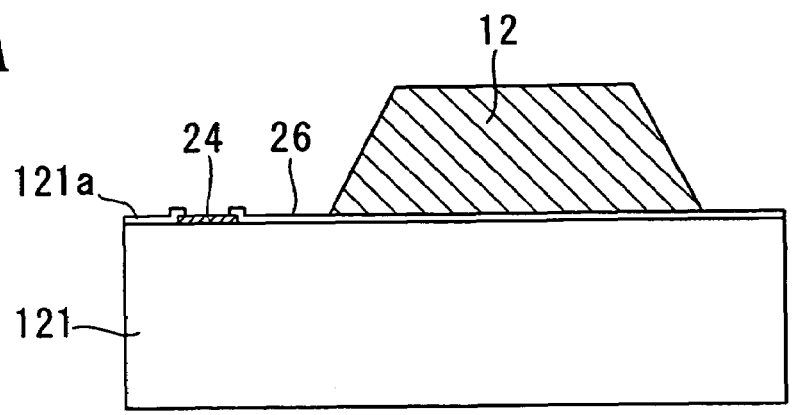
FIGS. 5A to 5D are process drawings to explain the manufacturing process of the semiconductor device of the first embodiment.

In this embodiment, as shown in FIG. 5A, a photosensitive resin is applied by a spin-coat method over the active face 121a of the semiconductor element 121 where the electrode pad 24 and the passivation layer 26 are formed. After ultraviolet ray exposure using a glass mask and developing with developing fluid, the resin is hardened by calcination at a high temperature. By these processes, the resin bump 12 is formed to the inside of the electrode pad line 24a, along the length of the electrode pad line 24a. It is desirable that the resin bump 12 be shaped as a trapezoid or half-cylinder in its cross-sectional surface by a photo lithography process using a gray mask so as to allow easy elastic deformation.

Figure 5B:
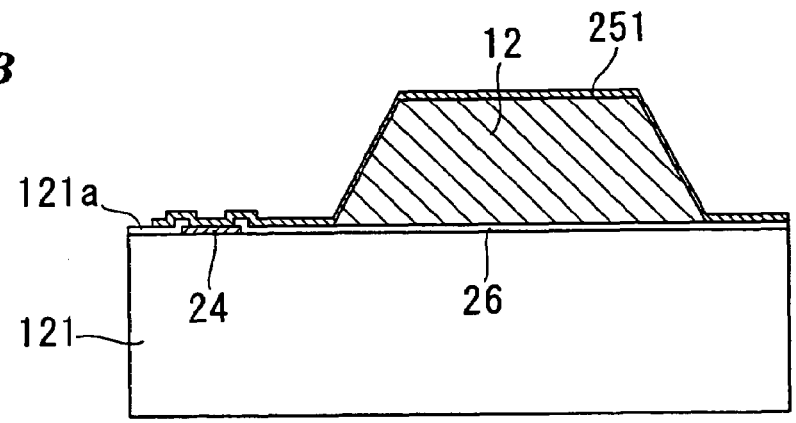
Figure 5C:
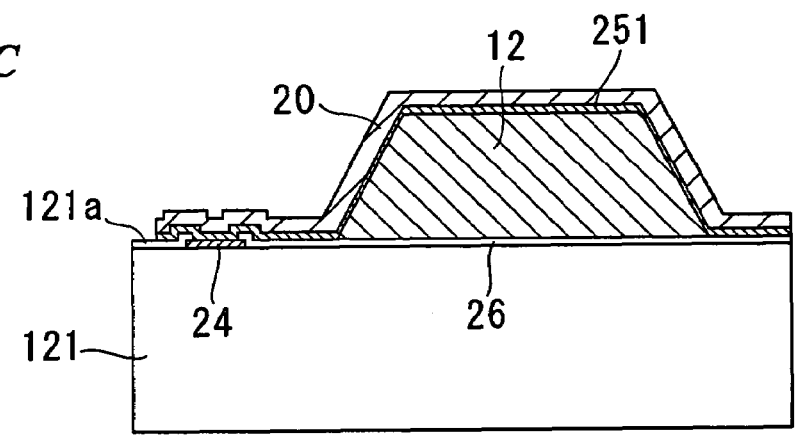

As shown in FIG. 5B, a conducting material 251 is formed as a sacrifice layer over the active face 121a of the semiconductor element 121 by vapor deposition or sputtering. Photoresist is applied on the sacrifice layer and apertures of the conductive layer pattern are formed on the photoresist. As shown in FIG. 5C, a metal plating layer such as Au plating forming the conductive layer 20 is deposited on the apertures by an electrolytic plating method while the conducting material 251 is used as the seed layer. By using the plating method, it is easy to make the conductive layer 20 become thicker, and contributes to the improving the reliability of the conductive layer 20. For example, the thickness of the conductive layer 20 can be made 2 or 3 micrometers by the electrolytic plating method even though the thickness of the conducting material 251 formed by sputtering is 0.3 micrometers. Therefore, the conducting material 251 can be etched while the conductive layer 20 remains. This also contributes to preventing breaking or removal of the conductive layer 20 when the semiconductor device 151 is joined to the board 111. The resistance of the conductive layer 20 can also be reduced.

Then the resist is removed, and the conducting material 251 is etched while the deposited metal plating layer (the conductive layer 20) is used as a mask.

The inventors of the present invention recognized that the etching rate depends on the surface condition of the board (such as the materials consisting the surface). For example, in a case where a resin bump made of an epoxy resin is formed on the board made of a silicon resin and TiW is plated thereon, the TiW plated on the resin bump is etched faster than the TiW plated on the silicon board by etching with hydrogen peroxide. This makes it possible to remove all of the TiW plated on the resin bump in a single etching process while a part of the TiW remains plated on the silicon board. Such a difference in the etching rate appears when other materials are used. For example, when the resin bump is made of polyimide resin, acrylic resin, phenol resin, epoxy resin, silicone resin, modified polyimide resin or other elastic resin materials and the passivation layer 26 is made of inorganic materials, except SiN, such as $SiO_2$, etching proceeds faster on the resin bump. The same effect is obtained when a metallic material, except TiW, such as Ti is used as the conducting material 251, and when an etching fluid other than hydrogen peroxide such as a solution of potassium iodide and iodine acid is used.

In this embodiment, the conducting material 251 on the resin bump 12 is selectively removed while the conducting material 251 on the passivation layer 26 (that is, on the active face 121 a) remains, utilizing the above-described difference in etching rate.

When a wet etching is carried out after laminating with the conducting material 251 and the conductive layer 20, the side etching of the conducting material 251 on the surface of the resin bump 12a becomes much larger than that of the conducting material 251 on the passivation layer 26 for the aforementioned reason. Then all of the conducting material 251 between the resin bump 12 and the conductive layer 20 is etched while a part of the conducting material 251 between the passivation layer 26 and the conductive layer 20 remains.

Figure 5D:
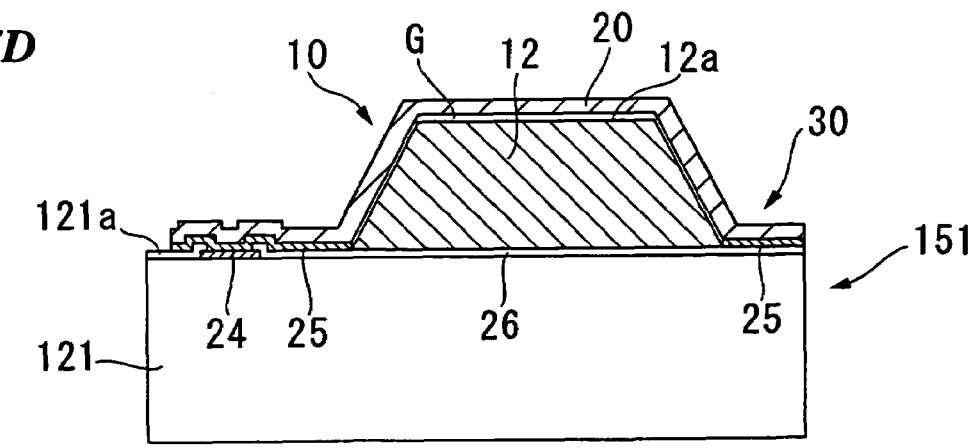

Through these processes, the space G shown in FIG. 5D is formed between the conductive layer 20 and the resin bump 12, and the conductive layer 20 and the resin bump 12 are arranged without adhesion. If the etching rate of the surface of the resin bump 12a is not high enough for the process, only the seed layer 25 on the resin bump is etched while another part except for the resin bump is masked by photoresist or other substances.

The resin bump electrode 10 may be separated by cutting the resin bump 12 in accordance with each electrode pad 24 after the plurality of conductive layers 20 are formed. Specifically, portions of the resin bump 12 without the conductive layer 20 (between each conductive layer 20) are removed by plasma etching using $O_2$ gas. Because the conductive layer 20 made of the metallic material is difficult to dry-etch compared with the resin material, the resin bump 12 without the conductive layer 20 can be selectively removed. Each conductive layer 20 may be formed on the single straight resin bump 12, but in a case where the resin bump is divided for each conductive layer 20, the effect of heat expansion or deformation of the resin bump 12 on each conductive layer 20 when the semiconductor device 151 is joined to the board 111 can be minimized.

As explained, the space G is formed on the resin bump electrode 10 between the conductive layer 20 and the resin bump 12 in this embodiment, and the space G means there is no adhesion between the conductive layer 20 and the resin bump 12. This structure, in conjunction with the resin bump 12, prevents the conductive layer 20 from elongation, shortening, and deforming when the semiconductor device 151 is joined to the board 111. The conductive layer 20 receives less stress than when it is joined to the resin bump making it hard to break.

With this structure, because the conductive layer 20 and the resin bump 12 have no adhesion, the conductive layer 20 on the resin bump 12 has no support in a case in which the formation of the conductive layer 20 is ended on the resin bump 12. The portion of the conductive layer 20 without support has a possibility of being removed by deformation in joining or other stress. In the embodiment, the conductive layer 20 is formed over the entire resin bump 12, and the conductive layer 20 joins the active face 121a. Therefore, both sides of the conductive layer 20 across the resin bump 12 (the side fixed to the electrode pad 24 and the side joined at the active face 121a across the resin bump 12) can be securely fixed on the active face 121a. The above-described removal can be prevented with such a structure.

Second Embodiment:

A Semiconductor Device.

Figure 6:
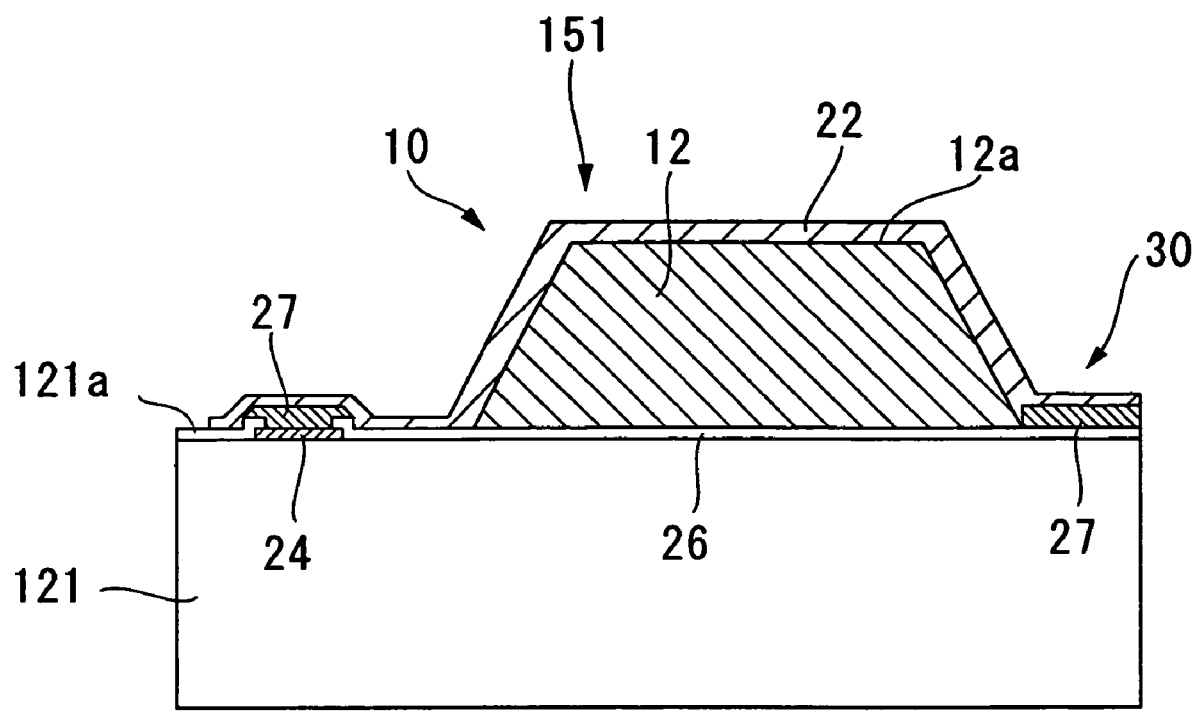
FIG. 6 is an enlarged view of the electrodes of the semiconductor device according to a second embodiment.

An explanation on the second embodiment of the present invention is given. FIG. 6 is a drawing showing the main portion of the resin bump electrode 10 of the embodiment. This drawing corresponds to FIG. 4B in the first embodiment.

The electrode pad, the resin bump, and the passivation layer and several other components in this embodiment have the same structure and arrangement as the first embodiment. Therefore, the same reference number is provided to these common components and portions, and a detailed explanation is omitted.

In this embodiment, a plurality of conductive layers 22 is formed from the surface of the electrode pad 24 to the surface of the resin bump 12. A barrier metal layer 27 is provided between the conductive layer 22 and the electrode pad 24 so that the metal of the conductive layer 22 does not expand to the electrode pad 24. The barrier metal layer 27 is provided on either side of the resin bump 12. The conductive layer 22 is formed by vapor deposition or sputtering of a noble metal such as Au or Cu. Because these noble metals are chemically stable, they react very little with water or oxygen in a resin. For example, Au does usually not generate any oxide, and Cu oxide is chemically unstable although it is generated. The adhesion between the conductive layer 22 and the resin bump 12 is strengthened by the chemical reaction caused by water or oxygen in the resin (oxidative reaction). But because the conductive layer 22 is made of a noble metal such as Au or Cu in the embodiment, no chemical reactions occur at the interface between the conductive layer 22 and the resin bump 12. Therefore, the conductive layer 22 and the resin bump 12 have weakened adhesion.

The conductive layer 22 is formed from the electrode pad 24 to the other side across the resin bump 12, and joins the active face 121a. That is, the conductive layer 22 joins the surface of the electrode pad 24, outside the resin bump 12, and is formed to the active face 121a, inside the resin bump 12, across the surface of the resin bump 12. The conductive layer 22 joins the barrier metal layer 27 or the passivation layer 26 provided on the active face 121a. The conductive layer 22 has no support on the resin bump 12, but because both sides of the conductive layer 22 across the resin bump 12 are fixed on the active face 121a, it is hard to be removed when joining the board 111.

As explained, since the conductive layer 22 and the resin bump 12 have weakened adhesion in this embodiment, it makes it possible to reduce the effect of expansion or deformation of the resin bump 12 when joining with heat, and to reduce breaking of the conductive layer 22.

Because the conductive layer 22 is made of a noble metal which is chemically stable, this embodiment makes it possible to form the conductive layer 22 on the resin bump 12 which has weakened adhesion by only plating a noble metal without the processes of forming and removing the seed layer 25 shown in the first embodiment. Therefore, it is possible to simplify the manufacturing process.

Electronic Device

Figure 7:
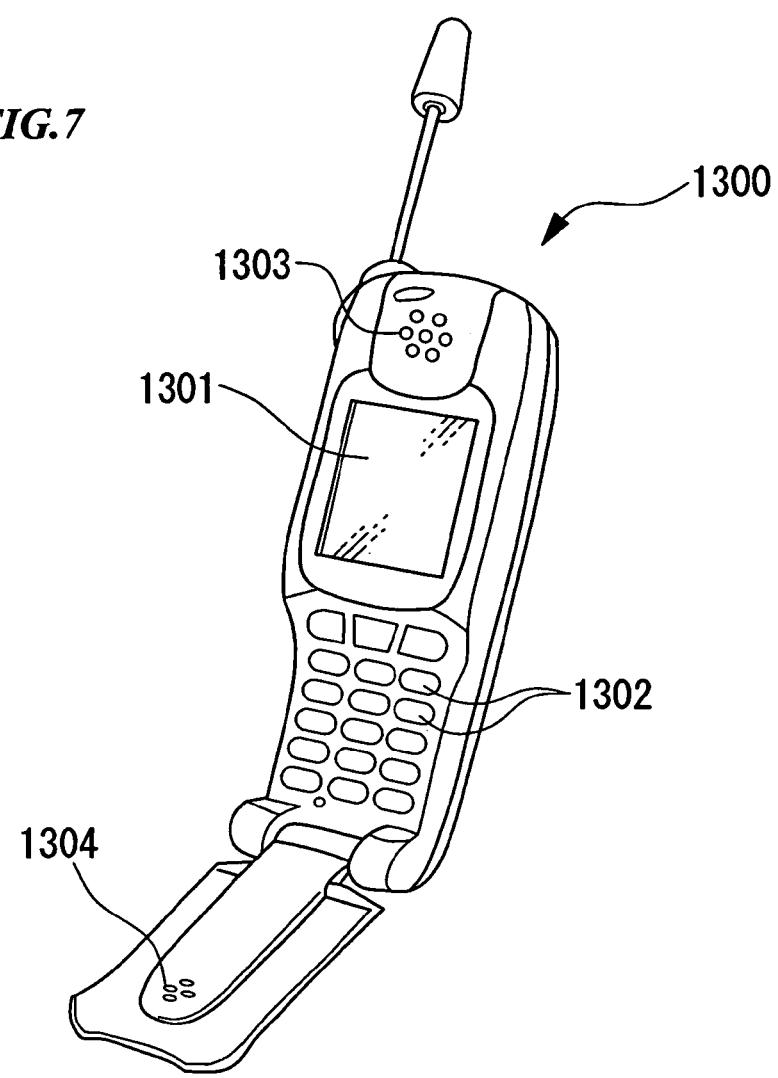
FIG. 7 is a perspective view of an example of an electronic device according to an embodiment of the present invention.
Figure 8:
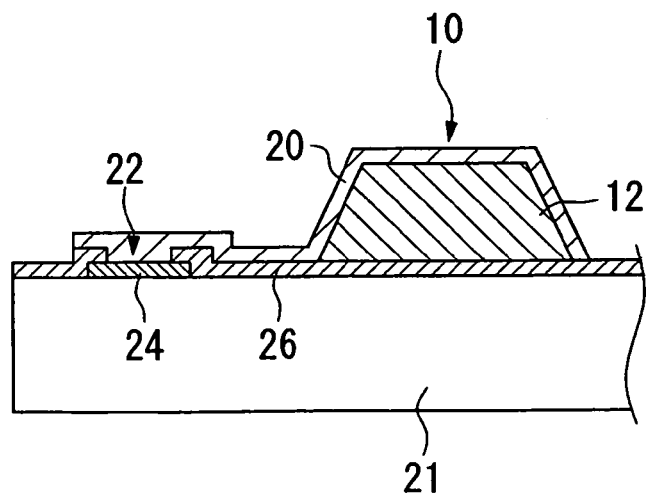
FIG. 8 is a drawing of a conventional resin bump electrode (a prior art).

An explanation of an electronic device which is equipped with the above-described electro-optic device or the semiconductor device is given. FIG. 7 is a perspective view of an example of an electronic device according to an embodiment of the present invention. A mobile phone 1300 shown in FIG. 7 has the above-described electro-optic device as a small-sized display 1301. It also has a plurality of operating buttons 1302, an ear piece 1303 and a mouthpiece 1304.

The above-described electro-optic device can be used as the image displaying device for not only mobile phones, but also electronic books, personal computers, digital still cameras, liquid crystal television sets, videotape recorders of view-finder type or direct monitor-view type, car navigation devices, pagers, electronic notepads, electronic calculators, word processors, workstations, videophones, point-of-sale terminals, and devices with touch sensitive panels. This makes it possible to provide the electronic devices with better reliability in their conductive connection in every case listed above.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A semiconductor device comprising:
   a semiconductor element;
   an electrode pad formed on the semiconductor element; and
   a bump electrode conductively connected to the electrode pad comprising:
   a resin bump formed on an active face of the semiconductor element; and
   a conductive layer provided from the electrode pad to the surface of the resin bump, the conductive layer and the resin bump being arranged without adhesion,
   wherein a space is formed between the conductive layer and the resin bump.

2. The semiconductor device according claim 1, wherein the conductive layer is made of Au or Cu.

3. The semiconductor device according to claim 1, wherein the conductive layer is formed from the electrode pad to the other side across the resin bump, and joins the active face on the other side.

4. The semiconductor device according to claim 1, further comprising:
   an electrode pad line along which a plurality of the electrode pads are arranged in a line on the active face, wherein the resin bump is formed straight along the electrode pad line, and the conductive layer is formed from each electrode pad to the surface of the resin bump.

5. A manufacturing method for a semiconductor device which has an electrode pad and a bump electrode conductively connected to the electrode pad on its active face, the manufacturing method comprising:
   forming a resin bump on a semiconductor element; and
   forming a conductive layer from the electrode pad to the surface of the resin bump without adhesion at the surface of the resin bump;
   wherein the forming of the conductive layer further includes:
   forming a sacrifice layer between the conductive layer and the resin bump: and forming a space between the conductive layer and the resin bump by removing the sacrifice layer on the resin bump.

6. The manufacturing method for a semiconductor device according to claim 5, wherein the conductive layer is formed from the electrode pad to the other side across the resin bump, and is joined to the active face at both ends across the resin bump.

7. The manufacturing method for a semiconductor device according claim 5, wherein the sacrifice layer on the surface of the resin bump is removed in the step of forming the space by etching utilizing the difference in etching rate between the surface of the active face and the surface of the resin bump while the sacrifice layer on the surface of the active face remains.

8. The manufacturing method for a semiconductor device according to claim 7, wherein the active face is made of an inorganic material.

9. The manufacturing method for a semiconductor device according to claim 5, wherein the conductive layer is formed by plating while the sacrifice layer is used as a seed layer.

10. The manufacturing method for a semiconductor device according to claim 5, wherein the step of forming the conductive layer includes vapor deposition or sputtering of a noble metal.

11. The manufacturing method for a semiconductor device according to claim 10, wherein the conductive layer is made of Au or Cu.

12. The manufacturing method for a semiconductor device according to claim 5, wherein a plurality of the electrode pads are arranged in a line on the active face and the step of forming the resin bump is carried out so that the resin bump is straight along the line of electrode pads, and the step of forming the conductive layer is carried out so that the conductive layer is formed from each electrode pad to the surface of the resin bump.

13. The manufacturing method for a semiconductor device according to claim 12, wherein the resin bump is cut and the bump electrode is separated according to each electrode pad.

14. A circuit board on which a semiconductor device according to claim 1 is mounted, wherein the semiconductor device is conductively connected to electrode terminals of a circuit board by a conductive layer formed on a resin bump.

15. The circuit board according to claim 14, wherein the conductive layer joins the circuit by elastic deformation of the resin bump and the semiconductor device and the electrode terminals are supported by a sealing resin surrounding the conductive connection of the semiconductor device and the electrode terminals.

16. An electro-optic device which is equipped with a semiconductor device according to claim 1.

17. An electro-optic device which is equipped with the circuit board according to claim 14.

18. An electronic device which is equipped with the circuit board according to claim 14.

19. An electronic device which is equipped with the electro-optic device according to claim 16.

20. An electronic device which is equipped with the electro-optic device according to claim 17.

* * * * *